United States Patent
Mabuchi

(10) Patent No.: US 8,188,522 B2
(45) Date of Patent: May 29, 2012

(54) BACK-ILLUMINATED TYPE SOLID-STATE IMAGING DEVICE

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/970,417

(22) Filed: Dec. 16, 2010

(65) Prior Publication Data

US 2011/0084317 A1    Apr. 14, 2011

Related U.S. Application Data

(62) Division of application No. 12/694,338, filed on Jan. 27, 2010, now Pat. No. 8,030,720, which is a division of application No. 11/268,965, filed on Nov. 8, 2005, now Pat. No. 7,795,676.

(30) Foreign Application Priority Data

Dec. 15, 2004  (JP) ................................ 2004-363580

(51) Int. Cl.
  *H01L 31/00* (2006.01)

(52) U.S. Cl. ........ 257/288; 257/291; 257/292; 257/293; 257/294; 257/E31.084; 257/431; 257/435; 257/447

(58) Field of Classification Search ............. 257/288, 257/291–294, 431, 435, 447, E31.11, E31.084
See application file for complete search history.

(56) References Cited

U.S. PATENT DOCUMENTS

| | | | |
|---|---|---|---|
| 4,454,526 A | 6/1984 | Nishizawa et al. | |
| 6,380,572 B1 * | 4/2002 | Pain et al. | 257/292 |
| 6,437,415 B1 | 8/2002 | Kuhara et al. | |
| 2005/0121655 A1 | 6/2005 | Bugnet et al. | |
| 2005/0205930 A1 | 9/2005 | Williams | |
| 2007/0001235 A1 * | 1/2007 | Rhodes | 257/384 |

FOREIGN PATENT DOCUMENTS

| | | |
|---|---|---|
| JP | 63-129661 | 6/1988 |
| JP | 63-260170 | 10/1988 |
| JP | 01-147861 | 6/1989 |
| JP | 02-089368 | 3/1990 |
| JP | 02-194558 | 8/1990 |
| JP | 10-209422 | 8/1998 |
| JP | 2002-314061 | 10/2002 |
| JP | 2003-031785 | 1/2003 |
| JP | 2003-338615 | 11/2003 |
| JP | 2004-055990 | 2/2004 |
| WO | 20041008537 | 1/2004 |

* cited by examiner

*Primary Examiner* — Cuong Q Nguyen
*Assistant Examiner* — Tran Tran
(74) *Attorney, Agent, or Firm* — SNR Denton US LLP

(57) ABSTRACT

A back-illuminated type solid-state imaging device including (a) a semiconductor layer on a front surface side of a semiconductor substrate with an insulation film between them; (b) a photoelectric conversion element that constitutes a pixel in the semiconductor substrate; (c) at least part of transistors that constitute the pixel in the semiconductor film; and (d) a rear surface electrode to which a voltage is applied on the rear surface side of the semiconductor substrate, wherein, (1) a semiconductor layer of an opposite conduction type to a charge accumulation portion of the photoelectric conversion element is formed in the semiconductor substrate under the insulation film, and (2) the same voltage as the voltage applied to the rear surface electrode is applied to the semiconductor layer.

5 Claims, 10 Drawing Sheets

BACK-ILLUMINATED TYPE SOLID-STATE IMAGING DEVICE

RELATED APPLICATION DATA

This application is a division of U.S. patent application Ser. No. 12/694,338, filed Jan. 27, 2010, which is a division of U.S. patent application Ser. No. 11/268,965, filed Nov. 8, 2005, the entirety of which is incorporated herein by reference to the extent permitted by law. The present application claims the benefit of priority to Japanese Patent Application No. JP 2004-363580 filed in the Japanese Patent Office on Dec. 15, 2004, the entirety of which is incorporated by reference herein to the extent permitted by law.

BACKGROUND OF THE INVENTION

The present invention relates to a back-illuminated type solid-state imaging device, particularly, to a CMOS solid-state imaging device of a back-illuminated type and a method for manufacturing thereof.

In the past, a CMOS solid-state imaging device of a back-illuminated type in which light is made incident from the rear surface side of a substrate to improve efficiency in using light and to obtain high sensitivity has been proposed as a CMOS solid-state imaging device. This back-illuminated type CMOS solid-state imaging device has a structure in which a CMOS transistor that constitutes a pixel is formed on the front surface side of a semiconductor substrate, a light receiving portion that becomes a photoelectric conversion element is formed to face the rear surface side of the substrate, and a multi-layer wiring is formed on the front surface side of the substrate, to make light incident from the rear surface side of the substrate. In this case, the rear surface on the opposite side to the front surface side where the multi-layer wiring of the semiconductor substrate is formed is polished to manufacture this solid-state imaging device.

In order to polish the semiconductor substrate stably, it is preferable that the thickness of a substrate is approximately 10 μm including a margin. Further, from a view point of sensitivity of red, it is preferable that the substrate has the thickness of this range. Here, in case of blue light and the like, since the photoelectric conversion is performed at a shallow position after the light is incident on the rear surface side of a silicon semiconductor substrate, it is necessary for a photoelectron to move a distance of approximately 10 μm until a charge accumulation portion on the front surface side.

On the other hand, a pixel pitch of, for example, 4 μm or less is not rare in recent years, and an aspect ratio (=substrate thickness/pixel pitch) becomes very large to be 3 or more in case of such minute pixel pitch. When the aspect ratio is large, it is difficult to manufacture a photoelectric conversion element of such shape and in addition, a photoelectron happens to enter an adjacent pixel while moving to the charge accumulation portion, which causes a crosstalk. Here, the crosstalk means that a signal of an adjacent pixel is mixed into a signal of an original pixel. When the crosstalk increases, a resolution becomes low and a color mixture occurs frequently in case of a CMOS solid-state imaging device of a single-plate type in which a color filter is attached to each pixel.

As a countermeasure for the above, Patent reference 1 proposes one in which an electric field is formed in a semiconductor substrate in a CMOS solid-state imaging device of a back-illuminated type. Since the electric field is formed, it becomes easy for a photoelectron to move in the depth direction of the substrate and the crosstalk can be reduced.

As another example of related art, the non-patent reference 1 has been presented.

[Patent Reference 1] Published Japanese Patent Application No. 2003-338615

[Non-patent Reference 1] Process and Pixels for High Performance Imager in SOI-CMOS Technology (authors: Xinyu Zheng, Sures hSeahadri, Michael Wood, Chris Wrigley, and Bedabrate Pain) presented in Session 3 of 2003 IEEE Workshop on Charge-Coupled Devices and Advanced Image Sensors

SUMMARY OF THE INVENTION

The above-described method of reducing the crosstalk by forming the electric field in the semiconductor substrate, which is described in the patent reference 1, is excellent in principle, however, there has been a limit to a strength of the electric field to be formed in a scope that is disclosed in an embodiment as a specific example thereof. When the electric field is formed by making use of a concentration gradient of an epitaxial layer, a potential difference of 1.1V or more which is a band gap of silicon may not be obtained. In addition, when an electrode is provided in the rear surface of the substrate, only a small voltage can be applied to the rear surface electrode in order not to make electric current flow between the rear surface electrode and a p-type semiconductor well region if a structure shown in FIGS. 7 and 8 of the patent reference 1 is used without modification.

On the other hand, in case of the non-patent reference 1, a pixel circuit is formed on an SOI (Semiconductor On Insulator) substrate and a photo diode is formed in a silicon substrate on the lower side. In this thesis, a light incident plane is not a rear surface but a front surface. Therefore, there is no awareness of the above-described problem, and accordingly there is no description with respect to a method for leading a photoelectron generated on the rear surface side to the front surface side.

Further, an electronic shutter operation is performed through a reset transistor in the CMOS solid-state imaging device of the back-illuminated type, and it has been difficult to operate an electronic shutter simultaneously with respect to all pixels. In addition, there also has been a desire for a further improvement of sensitivity in the CMOS solid-state imaging device of the back-illuminated type.

In view of the problems described above, the present invention provides a solid-state imaging device of a back-illuminated type in which an electric field to collect a signal charge (an electron, a hole, and the like, for example) is reliably generated to reduce the crosstalk.

Further, the present invention provides a solid-state imaging device of a back-illuminated type that enables an electronic shutter to be operated simultaneously with respect to all pixels, and a solid-state imaging device of a back-illuminated type in which a further improvement of sensitivity can be expected.

In addition, the present invention provides a method for manufacturing those solid-state imaging devices.

A back-illuminated type solid-state imaging device according to an embodiment of the present invention includes a semiconductor film on a semiconductor substrate through an insulation film, wherein a photoelectric conversion element that constitutes a pixel is formed in the semiconductor substrate, at least part of transistors that constitute the pixel is formed in the semiconductor film, and a rear surface electrode to which a voltage is applied is formed on the rear surface side of the semiconductor substrate.

In the above-described back-illuminated type solid-state imaging device of the present invention, the semiconductor substrate may be formed by using such a high resistance substrate that depletion layers from both the front and rear surfaces are linked with a voltage applied to the rear surface electrode.

In this back-illuminated type solid-state imaging device of the present invention, the voltage of the rear surface electrode during a light receiving period may be set to a voltage of a first polarity.

In this back-illuminated type solid-state imaging device of the present invention, a charge injection preventive film (an electron injection preventive film in case that the signal charge is an electron, and a hole injection preventive film in case that the signal charge is a hole, for example) may be formed between the rear surface electrode and the semiconductor substrate.

In the above-described back-illuminated type solid-state imaging device of the present invention, an electrically floating semiconductor layer of an opposite conduction type to a charge accumulation portion of a photoelectric conversion element may be formed in the semiconductor substrate under the insulation film.

In the above-described back-illuminated type solid-state imaging device of the present invention, a semiconductor layer of an opposite conduction type to a charge accumulation portion of a photoelectric conversion element may be formed in the semiconductor substrate under the insulation film and the same voltage as the voltage applied to the rear surface electrode may be applied to this semiconductor layer.

In the above-described back-illuminated type solid-state imaging device of the present invention, a first semiconductor layer of an opposite conduction type to a charge accumulation portion of a photoelectric conversion element may be formed in the semiconductor substrate under the insulation film and a second semiconductor layer of an opposite conduction type to the first semiconductor layer that becomes part of the photoelectric conversion element may be formed under the first semiconductor layer.

In the above-described back-illuminated type solid-state imaging device of the present invention, an interface between the solid-state imaging device and the outside may include both bumps and wire bonding to the rear surface electrode.

In the above-described back-illuminated type solid-state imaging device of the present invention, the photoelectric conversion element may be reset by applying a voltage of a second polarity to the rear surface electrode.

In the above-described back-illuminated type solid-state imaging device of the present invention, a transfer transistor constituting the pixel may be formed in the semiconductor film.

In the above-described back-illuminated type solid-state imaging device of the present invention, a transfer transistor constituting the pixel may be formed in the semiconductor substrate and the photoelectric conversion element is formed into a buried type.

According to the present invention, in the above-described back-illuminated type solid-state imaging device in which the voltage of the rear surface electrode is made to be the voltage of the first polarity and the charge injection preventive film is provided between the rear surface electrode and the semiconductor substrate, a charge multiplication can be performed in the semiconductor substrate.

A method for manufacturing a back-illuminated type solid-state imaging device according to an embodiment of the present invention includes the processes of: preparing a substrate having a semiconductor film on a semiconductor substrate through an insulation film, forming in the semiconductor substrate a photoelectric conversion element that constitutes a pixel, forming in the semiconductor film at least part of transistors that constitute the pixel, and forming on the rear surface side of the semiconductor substrate a rear surface electrode to which a voltage is applied.

In the above-described method for manufacturing the back-illuminated type solid-state imaging device of the present invention, the semiconductor substrate may be formed by using such a high resistance substrate that depletion layers from both the front and rear surfaces of the substrate are linked with the voltage applied to the rear surface electrode.

The above-described method for manufacturing the back-illuminated type solid-state imaging device of the present invention may further include a process of forming on the rear surface of the semiconductor substrate before forming the rear surface electrode a charge injection preventive film (an electron injection preventive film in case that a signal charge is an electron, and a hole injection preventive film in case that the signal charge is a hole, for example).

The above-described method for manufacturing the back-illuminated type solid-state imaging device of the present invention may further include a process of forming in the semiconductor substrate under the insulation film a semiconductor layer of an opposite conduction type to a charge accumulation portion of the photoelectric conversion element.

In the above-described method for manufacturing the back-illuminated type solid-state imaging device of the present invention, transistors including a transfer transistor that constitute the pixel may be formed in the semiconductor film.

The above-described method for manufacturing the back-illuminated type solid-state imaging device of the present invention may further include a process of forming a transfer transistor among transistors that constitute the pixel and forming the photoelectric conversion element to be a buried type in the semiconductor substrate.

According to the back-illuminated type solid-state imaging device of the present invention, the photoelectric conversion element that constitutes the pixel is formed in the semiconductor substrate under the insulation film, at least part of transistors that constitute the pixel is formed in the semiconductor film on the insulation film, and the rear surface electrode is formed on the rear surface side of the semiconductor substrate, and so by applying a required voltage, which is, for example, a negative voltage when an electron is a signal charge and a positive voltage when a hole is a signal charge, to the rear surface electrode, the electric field to collect the signal charge can be generated reliably in the photoelectric conversion element and the crosstalk to the adjacent pixels can be reduced.

With the above-described semiconductor substrate being formed using a high resistance substrate, in which the depletion layers from both the front and rear surfaces of the substrate are linked when a voltage is applied to the rear surface electrode, a photoelectric conversion in the high resistance substrate can be made reliably and the electric field to collect the signal charge can be generated reliably.

By making the voltage of the rear surface electrode during the light receiving period set to the voltage of the first polarity, which is, for example, the negative voltage when the electron is the signal charge and the positive voltage when the hole is the signal charge, the electric field to collect the signal charge can be generated reliably in the photoelectric conversion element.

By forming the charge injection preventive film between the rear surface electrode and the semiconductor substrate, the injection of the charge from the rear surface electrode to the semiconductor substrate can be prevented when the voltage of the first polarity is applied to the rear surface electrode.

By forming the electrically floating semiconductor layer of the opposite conduction type to the charge accumulation portion of the photoelectric conversion element in the semiconductor substrate under the insulation film, the electric current can be prevented from flowing when the voltage of the first polarity is applied to the rear surface electrode to generate the electric field. Further, a charge from an interface is recombined by means of this electrically floating semiconductor layer, and a dark current can be suppressed.

By applying the same voltage as the rear surface electrode to the above-described semiconductor layer of the opposite conduction type, the electric field is generated in the semiconductor substrate and the electric current can be prevented from flowing.

By forming the second semiconductor layer of the opposite conduction type, which is opposite to the above-described first semiconductor layer of the opposite conduction type, under the first semiconductor layer, the electric field may be almost vertically generated in the semiconductor substrate, and a collection of the signal charge can be improved to be performed uniformly.

The solid-state imaging device interfaces the outside using the bumps and wire bonding, which is easy to be carried out.

By applying to the rear surface electrode the voltage of the second polarity, which is, for example, the positive voltage when the electron is the signal charge and the negative voltage when the hole is the signal charge, the photoelectric conversion element can be reset, that is, the signal charges accumulated in all the pixels are discharged to the rear surface electrode side and the simultaneous electronic shutter operation to all the pixels can be performed.

By forming transistors including the transfer transistor in the semiconductor layer on the insulation film, the pixel can be formed to have one photoelectric conversion element and a plurality of transistors including the transfer transistor.

By forming the transfer transistor in the semiconductor substrate under the insulation film, the pixel can be formed to have one photoelectric conversion element and a plurality of transistors including the transfer transistor. In addition, by making the photoelectric conversion element formed into the buried type, the charge from the interface can be recombined and the dark current can be suppressed.

With the voltage to the rear surface electrode being made into the voltage of the first polarity and an electron multiplication being performed in the semiconductor substrate, a back-illuminated type solid-state imaging device which has less noise and improved sensitivity can be provided.

According to the method for manufacturing the back-illuminated type solid-state imaging device of the present invention, a back-illuminated type solid-state imaging device whose reliability is excellent can be manufactured in which the electric field to collect the signal charge generated in the above-described photoelectric conversion element can be generated reliably and the crosstalk to the adjacent pixels can be reduced, for example.

DESCRIPTION OF THE PREFERRED EMBODIMENTS

Hereinafter, embodiments of the present invention are explained by referring to the accompanied drawings.

Figure 1:
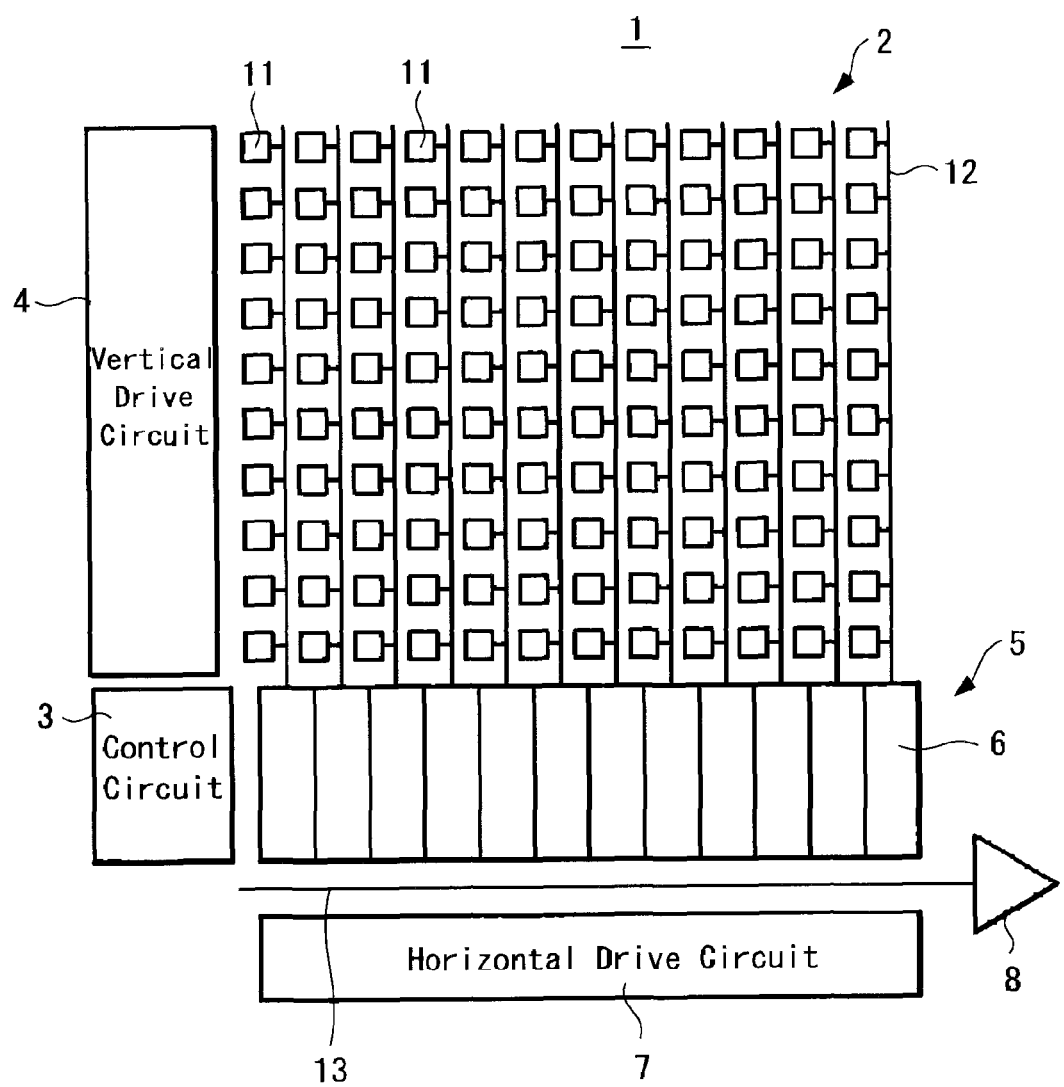
FIG. 1 is a schematic constitutional diagram showing the whole configuration of a back-illuminated type solid-state imaging device according an embodiment of the present invention.

FIG. 1 shows the whole configuration of a back-illuminated type solid-state imaging device, that is, a CMOS solid-state imaging device of a back-illuminated type, according to an embodiment of the present invention. A CMOS solid-state imaging device 1 of this embodiment is configured to have a pixel portion 2, a control circuit 3, a vertical drive circuit 4, a column portion 5, a horizontal drive circuit 7, and an output circuit 8.

In the pixel portion 2, a plurality (a large number) of pixels 11 are regularly arranged in a two dimensional manner, in other words, are arrayed in two-dimensional matrix form, for example. The control circuit 3 receives an input clock and data that commands an operation mode and the like, and outputs data including information on the solid-state imaging device. The vertical drive circuit 4 selects a row of the pixel 11 in the pixel portion 2, and supplies a necessary drive pulse to the pixel 11 in that row through a control wiring of in the lateral direction which is not illustrated.

Here, a vertical signal line 12 is specifically illustrated in the drawing although the vertical signal line is part of the pixel 11. An output of the pixel 11 of the selected row is sent to the column portion 5 through the vertical signal line 12. A column signal processing circuit 6 is arrayed in the column portion 5 correspondingly to the row of the pixel 11. The column portion 5 receives a signal by a row of the pixels 11, and processing of CDS (Correlated Double Sampling: processing of fixed pattern noise removal), signal amplification, analogue/digital (A/D) conversion, and the like is performed with respect to the signal.

The horizontal drive circuit 7 sequentially selects the column signal processing circuit 6, and leads a signal thereof to a horizontal signal line 13. The output circuit 8 processes and outputs the signal read out to the horizontal signal line 13. For example, there is a case where only buffering is performed, and there is also a case where an adjustment of a black level, column offset correction, signal amplification, color related processing, and the like are performed before that.

Figure 2:
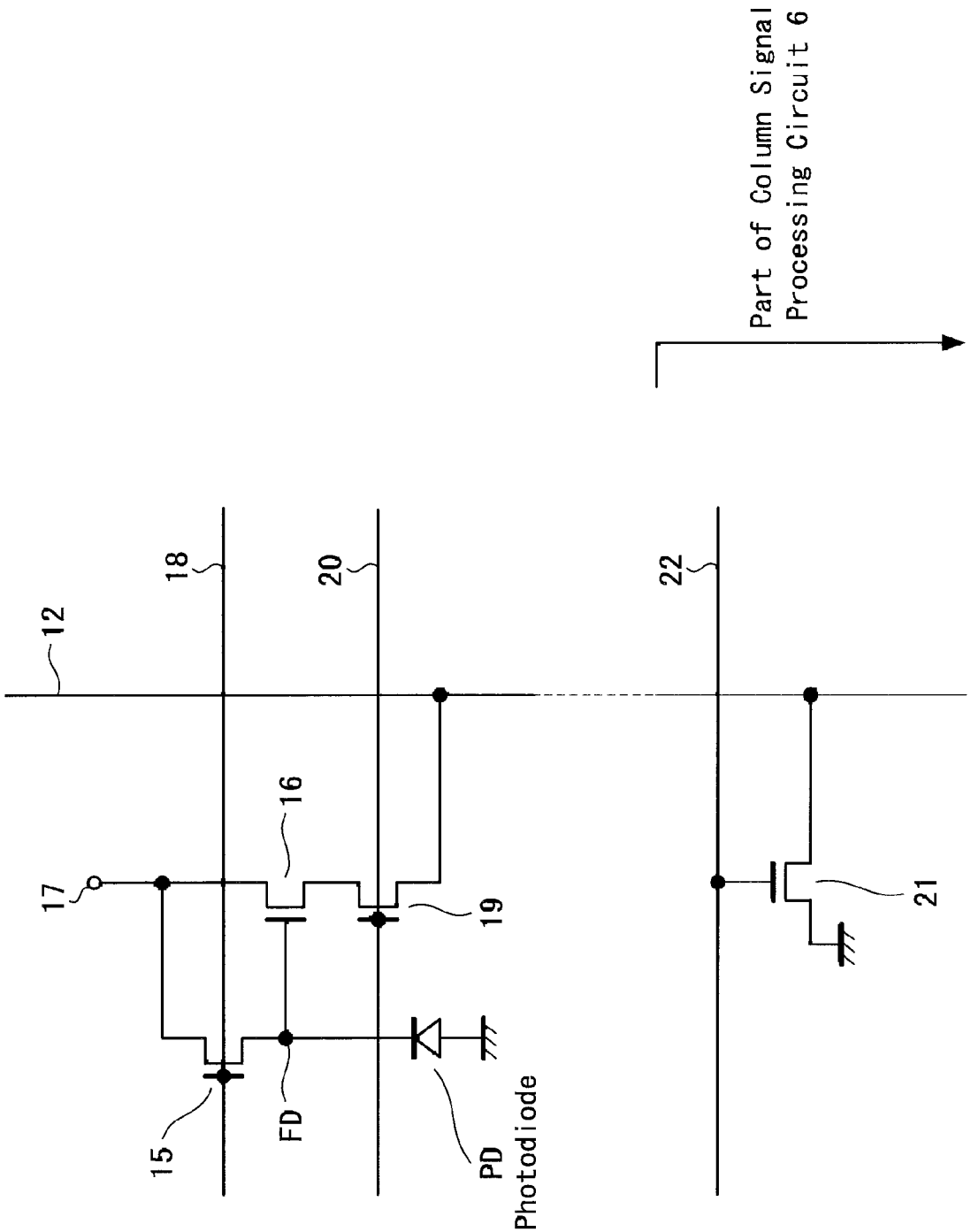
FIG. 2 is an equivalent circuit diagram corresponding to one pixel of FIG. 1.

FIG. 2 is an example of an equivalent circuit of one pixel. In this embodiment, a photoelectric conversion element that is a photodiode PD, for example, is connected to a source of a reset transistor 15, and what is called a floating diffusion FD between the photodiode PD and the source of the reset transistor is connected to a gate of an amplifier transistor 16. Specifically, a node electrically connected to the gate of the amplifier transistor 16 is called the floating diffusion FD. A drain of the reset transistor 15 is connected to a power wiring 17 from which a power source voltage Vdd is supplied, and the gate thereof is connected to a reset wiring 18 from which a reset pulse is supplied. A drain of the amplifier transistor 16 is connected to the power wiring 17, and a source thereof is connected to a drain of a selector transistor 19. A selector wiring 20 is connected to a gate of the selector transistor 19. On the other hand, a source of the selector transistor 19 is connected to the vertical signal line 12, and a load transistor 21 whose drain is connected to this vertical signal line 12 and which becomes a constant current source is provided as part of the column signal processing circuit 6 (refer to FIG. 1). A load wiring 22 is connected to a gate of the load transistor 21.

In this pixel circuit, the photoelectric conversion is performed in the photodiode PD. A signal charge of the photodiode PD, which is an electron in this embodiment, is transferred to the gate of the amplifier transistor 16 through the floating diffusion FD. When the selector transistor 19 is ON, a signal corresponding to an electric potential of the floating diffusion FD is output to the vertical signal line 12 through the amplifier transistor 16.

The reset transistor 15 resets the signal charge of the floating diffusion FD by discharging the signal charge (electron) of the floating diffusion FD into the power wiring 17. Each of the lateral direction wirings 18 and 20 is common to the pixels in the same row and is controlled by the vertical drive circuit 4.

In part of the column signal processing circuit 6, the load transistor 21 that is a constant current source is provided to constitutes a source follower through the selector transistor 19 of the selected row, and output to the vertical signal line 12 is performed.

Figure 3:
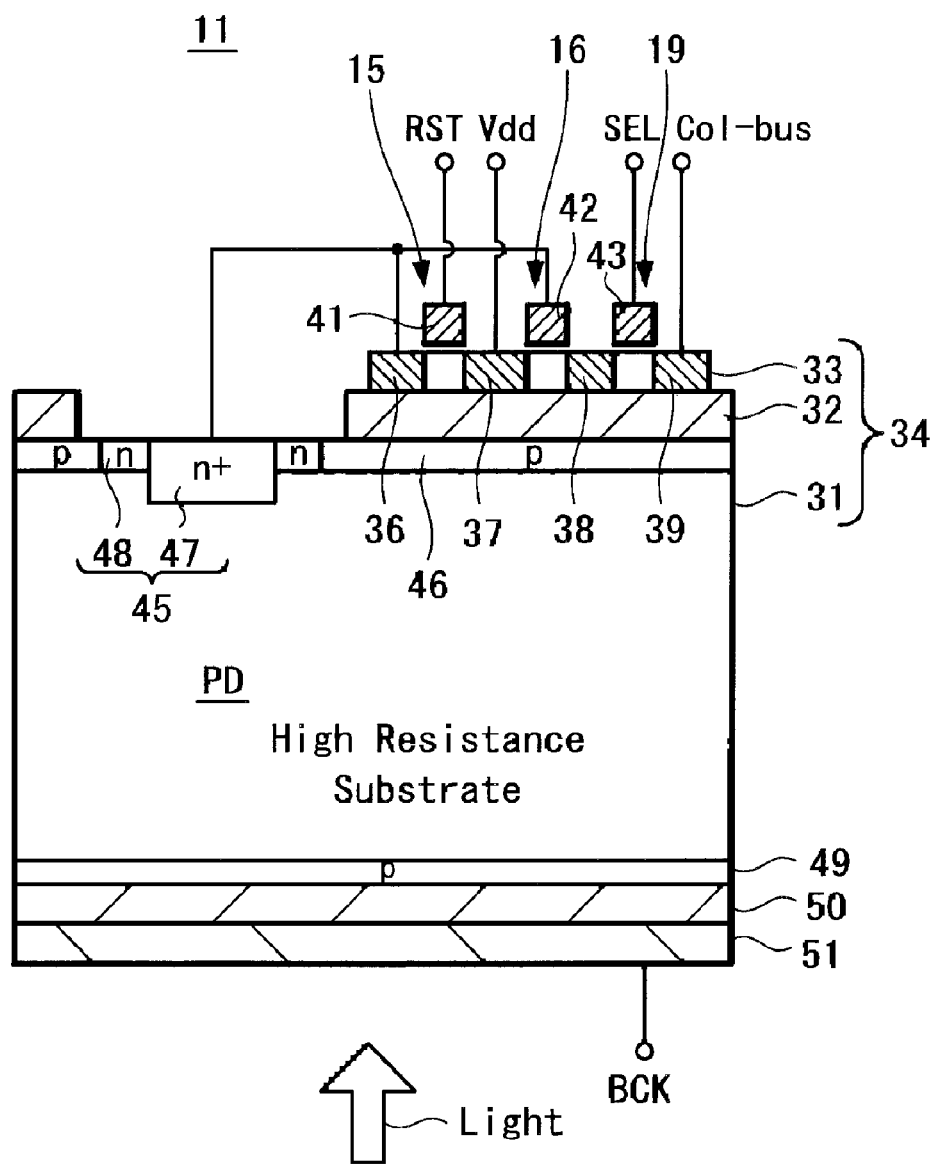
FIG. 3 is a cross-sectional diagram showing a relevant portion of a pixel according to a first embodiment of a back-illuminated type solid-state imaging device of the present invention.

FIG. 3 shows a cross section of a relevant portion of a pixel in a first embodiment of a CMOS solid-state imaging device according to the present invention. The CMOS solid-state imaging device of this embodiment includes what is called a SOI substrate 34 which has a silicon semiconductor film 33 provided on a silicon semiconductor substrate 31 through an insulation film 32 that is a buried silicon oxide film, for example.

In this embodiment, each of the reset transistor 15, amplifier transistor 16, and selector transistor 19 is formed in the semiconductor film 33 on the insulation film 32 of the SOI substrate 34. Specifically, the reset transistor 15 is formed with source-drain regions 36 and 37 of n-type that is a second conduction type formed in the semiconductor film 33 of p-type that is a first conduction type in this embodiment and a gate electrode 41 formed through a gate insulation film; the amplifier transistor 16 is formed with source-drain regions 37 and 38 of n-type and a gate electrode 42 formed through the gate insulation film; and the selector transistor 19 is formed with source-drain regions 38 and 39 of n-type and a gate electrode 43 formed through the gate insulation film.

The silicon semiconductor substrate 31 on the lower side of the insulation film 32 is formed using a high resistance substrate, and in part of the surface thereof is formed a semiconductor region 45 of the second conduction type that is n-type in this embodiment, which becomes a charge accumulation layer of the photodiode PD. A semiconductor layer 46 of p-type that is the first conduction type is formed in the surface of the other part of the silicon substrate on the lower side of the insulation film 32. This p-type semiconductor layer 46 reduces a dark current from an interface. With respect to the n-type semiconductor region 45 of the photodiode PD, an area around a contact portion is formed with a high impurity concentration region, for example, a high impurity concentration region 47 of approximately $10^{20}$ cm$^{-3}$ and a surrounding area thereof is formed with a low impurity concentration region, for example, a low impurity concentration region 48 of approximately $10^{18}$ cm$^{-3}$. The high resistance substrate 31 is made of such a high resistance substrate that depletion layers from both the front and rear surfaces of the substrate are linked when a voltage is applied to a rear surface electrode as described later on.

The p-type semiconductor layer 46 under the insulation film 32 has an impurity concentration of approximately $10^{18}$ cm$^{-3}$, for example. The impurity concentration of the semiconductor substrate that is the high resistance substrate 31 is $10^{16}$ cm$^{-3}$ or less, preferably in the range of approximately $10^{12}$ cm$^{-3}$ to $10^{15}$ cm$^{-3}$, and is made to be a low impurity concentration of approximately $10^{13}$ cm$^{-3}$ in this embodiment. Although the high resistance substrate 31 is n-type in this embodiment, p-type may also be used. The thickness of the high resistance substrate 31 can be approximately 10 μm, for example. A p-type semiconductor layer 49 having a high impurity concentration of approximately $10^{19}$ cm$^{-3}$, for example, is formed on the rear surface side of the high resistance substrate 31. Further, a rear surface electrode that is a transparent electrode 51 in this embodiment is formed on the p-type semiconductor layer 49 on the rear surface side of the substrate through an electron injection preventive layer 50. The electron injection preventive layer 50 can be made of antimony trisulfide by a vacuum evaporation method and p-type amorphous silicon carbide by a plasma CVD, for example. The transparent electrode 51 can be made of an ITO (indium tin oxide) film by a sputtering method, for example.

The transistors 15, 16, and 19 of the pixel 11 are wired reflecting the circuit diagram of FIG. 2, and the source-drain regions are partly shared as described above. Specifically, part of the insulation film 32 and semiconductor film 33 is removed so that the n-type semiconductor region 45 of the photodiode PD is exposed, the high concentration impurity region 47 of the n-type semiconductor region 45 is connected to the source-drain region 36 of the reset transistor 15 and to the gate electrode 42 of the amplifier transistor 16 through the internal wiring, and the circuit connection of FIG. 2 is made.

Next, an explanation is made with respect to an operation of the CMOS solid-state imaging device of the back-illuminated type according to the first embodiment.

In this CMOS solid-state imaging device, light L enters the high resistance substrate 31 of the photodiode PD from the rear surface side of the substrate through the transparent electrode 51.

The p-type semiconductor layer 46 under the insulation layer 32 is an electrically floating layer. A negative voltage of −2V, for example, is applied to the transparent electrode 51 through a terminal BCK. Here, the voltage 0 is a voltage of a GND terminal of the CMOS solid-state imaging device, or is a body bias of the pixel transistors 15, 16, and 19, or is a GND voltage for the load transistor 21 of FIG. 2.

A voltage of the n-type semiconductor region 45 of the photodiode PD is a value dropped from a value close to the power source voltage immediately after the floating diffusion FD is reset by the reset transistor 15 by means of an inflow of the photoelectron, however this value is limited to a positive value. A mechanism thereof is such that the reset transistor 15 is made to be a depletion type whose threshold voltage Vth is −0.3V or less and thereby the electron of the floating diffusion FD is discharged into the power wiring 17 through the reset transistor 15 when the voltage of the floating diffusion FD becomes close to 0V.

Since the thickness is around 10 μm and the concentration is low, the high resistance substrate 31 is depleted by the negative voltage applied to this transparent electrode 51, that is, the electric field is generated inside the high resistance substrate 31. Because of this electric field, the positive hole out of the electron and positive hole generated inside the high resistance substrate 31 moves toward the rear surface side of the substrate, and the electron moves toward the n-type semiconductor region 45 of the photodiode PD, particularly to the high impurity concentration region 47 thereof. Specifically, in essence the above-described negative voltage is to make the substrate 31 depleted rather than to be the negative voltage.

Here, since the p-type semiconductor layer 46 is electrically floating and there is no p-type semiconductor layer applying the bias of 0V to the pixel 11, no constant current flows between the p-type semiconductor layer 46 and the transparent electrode 51 on the rear surface. Therefore, a voltage of a large absolute value such as −2V can be applied to the terminal BCK of the transparent electrode 51, and the electric field which is large enough to collect the electrons in the n-type semiconductor region 45 of the photodiode PD can be generated in the high resistance substrate 31.

According to the first embodiment of the CMOS solid-state imaging device of the back-illuminated type, the SOI substrate is used in which the pixel transistor is formed in the semiconductor layer on the insulation film, the semiconductor substrate under the insulation film is made to be the high resistance substrate, the n-type semiconductor region of the photodiode is formed in part of the surface thereof, the electrically floating p-type semiconductor layer is formed in the other part of the surface, and the transparent electrode is formed on the rear surface side of the high resistance substrate, to which the negative voltage is applied, and so the large electric field to collect the photoelectrons into the n-type semiconductor region of the photodiode can be generated reliably inside the high resistance substrate. Accordingly, the photoelectron can be moved with further certainty to the n-type semiconductor region that is the charge accumulation layer, and the crosstalk to the adjacent pixels can be reduced.

In addition, since the electron injection preventive layer is formed between the p-type semiconductor layer and the transparent electrode on the rear surface side of the high resistance substrate, the injection of the electron from the transparent electrode to the inside of the high resistance substrate can be prevented even when the negative voltage is applied. Further, the insulation film of the SOI substrate also serves as the hole injection preventive layer that prevents the hole from being injected into the high resistance substrate.

Figure 4:
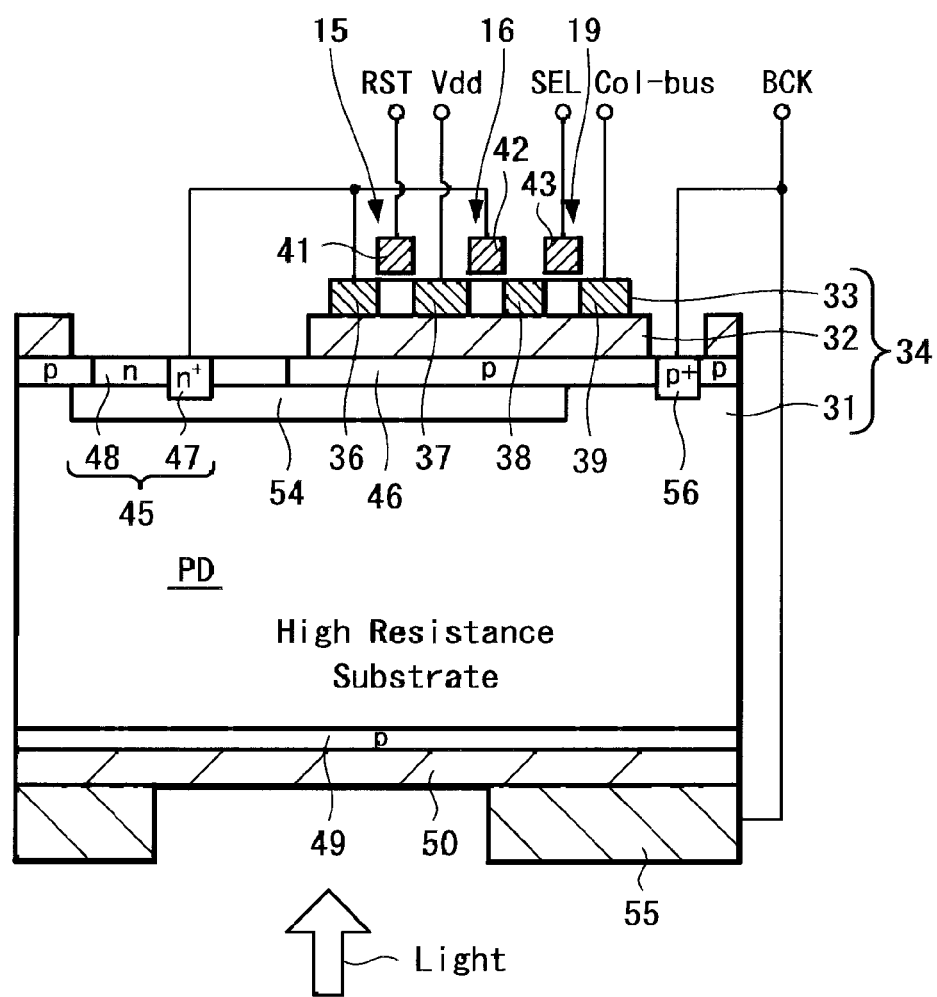
FIG. 4 is a cross-sectional diagram showing a relevant portion of a pixel according to a second embodiment of a back-illuminated type solid-state imaging device of the present invention.

FIG. 4 shows a cross section of a relevant portion of a pixel in a second embodiment of a CMOS solid-state imaging device of a back-illuminated type according to the present invention. The CMOS solid-state imaging device of this embodiment has a structure of the above-described embodiment of FIG. 3, in which further an n− semiconductor region 54 whose impurity concentration is lower than the n-type semiconductor region 45 is formed extending on the front surface side of the substrate from part of the portion under the p-type semiconductor layer 46 to the portion under the n-type semiconductor region 45, the transparent electrode 51 on the rear surface side of the substrate is not provided and a rear surface electrode 55 that also serves as a light-shielding film to shield a boundary of pixels is formed on the electron injection preventive film 50 on the rear surface side of the substrate, and the same voltage as the rear surface electrode 55 is applied to the p semiconductor layer 46 on the front surface side of the substrate through a p+ contact region 56. The impurity concentration of the n− semiconductor region 54 can be made into approximately $10^{16}$ cm$^{-3}$, for example. The rear surface electrode 55 can be formed by using a metal film such as an aluminum (Al) film by sputtering, for example.

Since the other structure is the same as FIG. 3, the same reference numerals are given to corresponding portions, and a redundant explanation thereof is omitted.

According to the second embodiment of the CMOS solid-state imaging device of the back-illuminated type, since the n− semiconductor region 54 is provided extending from part of the portion under the p-type semiconductor region 46 to the portion under the n semiconductor region 45 of the photodiode PD, electrons are collected into the n− semiconductor region 54 and are further collected into the n-type semiconductor region 45. Accordingly, an area to collect electrons increases, and a color mixture due to the fact that the photoelectron enters an adjacent pixel can be further reduced. Further, since the electric field generated in the high resistance substrate 31 becomes further closer to the vertical by means of the n− semiconductor region 54 in comparison to FIG. 3, the direction of the electric field becomes uniform and an unevenness regarding the electron collection can be reduced.

Further, since the rear surface electrode 55 made of a metal film which also serves as the light-shielding film is provided, a resistance of the rear surface electrode 55 can be lowered in comparison to the case where only the transparent electrode is provided. In addition, when a color filter is formed for each pixel, light passing through a boundary portion of the color filters is blocked, and a color mixture caused due to the above can be prevented.

The electric potential of the p-type semiconductor layer 46 can be stabilized by applying to the p-type semiconductor layer 46 on the front surface side of the substrate the same voltage as that to the rear surface electrode 55.

Other than the above, there can be obtained a similar effectiveness to the first embodiment of FIG. 3, in which, for example, the electric field to collect the photoelectrons into the photodiode PD is generated reliably and the crosstalk to the adjacent pixels can be reduced.

Figure 9:
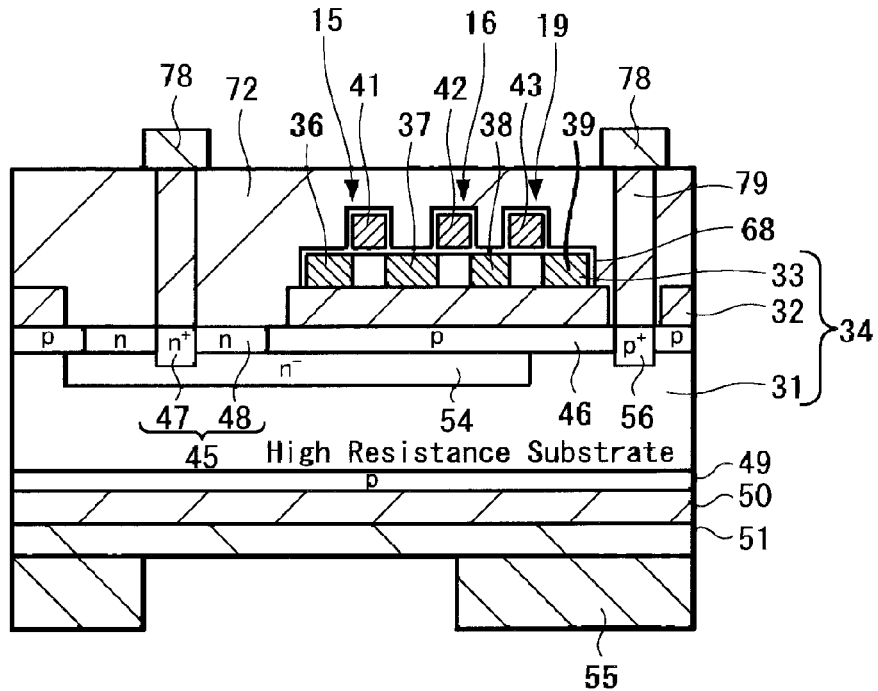
FIG. 9 is a manufacturing process diagram (5/5) showing an embodiment of a method for manufacturing a back-illuminated type solid-state imaging device according to the present invention.

In the structure of FIG. 4, the transparent electrode 51 of FIG. 2 may not be removed and both the transparent electrode 51 and the rear surface electrode 55 also serving as the light-shielding film may be formed (refer to FIG. 9).

Three elements in the structure of FIG. 4, which are (1) the n− semiconductor region 54, (2) the rear surface electrode 55 that shields the boundary of pixels, and (3) the application of the same voltage as the rear surface electrode 55 to the p-type semiconductor layer 46 on the front surface side of the substrate, are not necessarily implemented simultaneously, but it is possible to select appropriately any element from (1) through (3) depending on a product to be manufactured.

For example, in the structure of FIG. 4, the n-semiconductor region 54 can be omitted, the p-type semiconductor layer 56 on the front surface side of the substrate can be made to be electrically floating, and the transparent electrode 51 of FIG. 3 can be provided instead of the rear surface electrode 55. Further, in the structure of FIG. 3, the same voltage as the transparent electrode 51 can be applied to the p semiconductor layer 46 on the front surface side of the substrate.

Next, an embodiment of a method for manufacturing a back-illuminated type solid-state imaging device according to the present invention is explained using FIGS. 5 through 9. In this embodiment, the present invention is applied when manufacturing a CMOS solid-state imaging device of the back-illuminated type that includes the n− semiconductor region 54 and rear surface electrode 55 also serving as the light shielding film shown in FIG. 4.

Figure 5A:
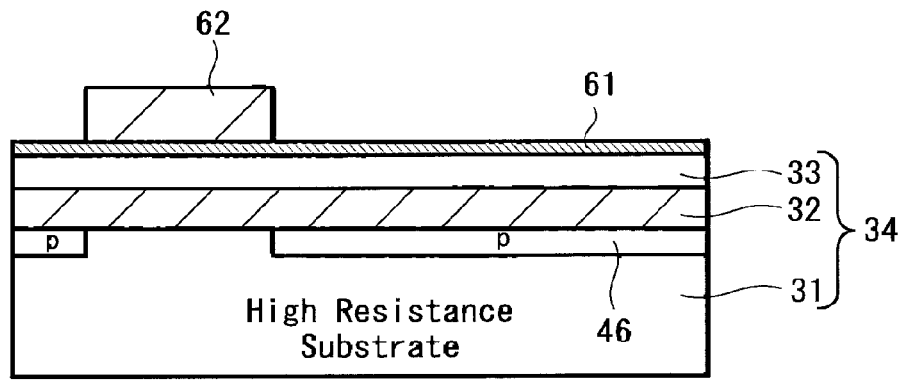
FIGS. 5A through 5C are manufacturing process diagrams (1/5) showing an embodiment of a method for manufacturing a back-illuminated type solid-state imaging device according to the present invention.

First, as shown in FIG. 5A, the SOI substrate 34 is prepared in which on the silicon semiconductor substrate 31 that is a high resistance substrate is provided the silicon semiconductor film 33 of the first conduction type, for example p-type, through the insulation film (what is called a buried silicon oxide film) 32. After a protective oxide film 61 made of a silicon oxide film, for example, is formed on the semiconductor film 33 of this SOI substrate 34, the p-type semiconductor layer 46 is formed by performing ion implantation of a p-type impurity through a resist mask 62 into a necessary region of the high resistance substrate 31 under the insulation film 32, specifically into a necessary region other than a region where an n-type semiconductor region of a photodiode is formed later on.

Figure 5B:
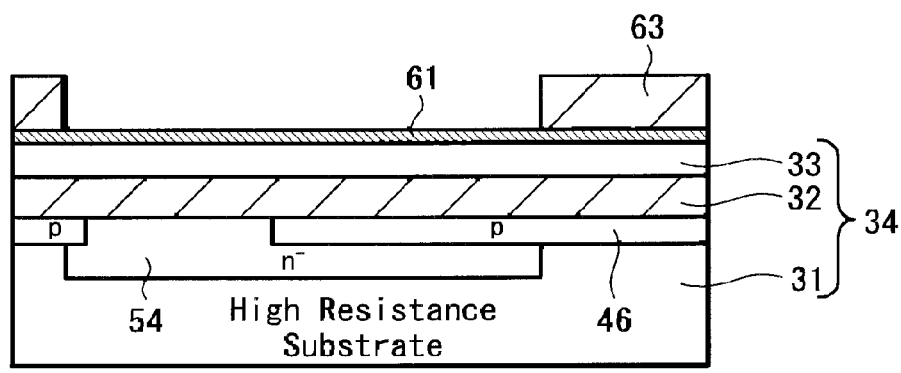

Next, as shown in FIG. 5B, an n-type impurity is ion-implanted into a necessary region somewhat deeper than the p-type semiconductor layer 46 of the high resistance substrate 31 through a resist mask 63 newly formed on the protective insulation film 61 to form the n− semiconductor region 54 constituting part of the photodiode PD.

Figure 5C:
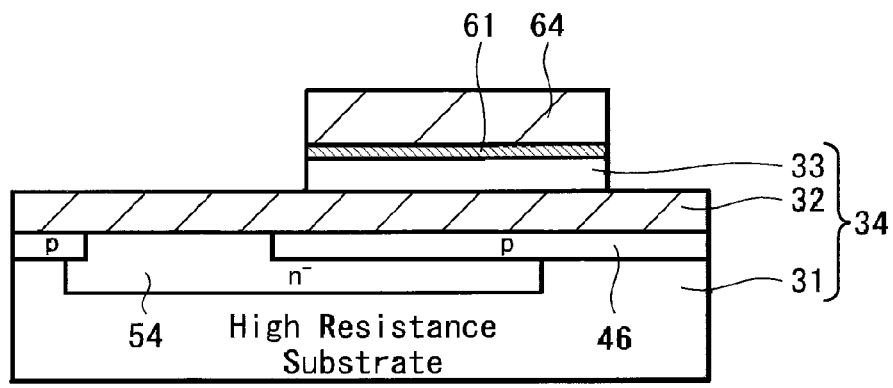

Next, as shown in FIG. 5C, an unnecessary portion of the semiconductor film 33 of the SOI substrate 34 is selectively removed by etching through a resist mask 64.

Figure 6A:
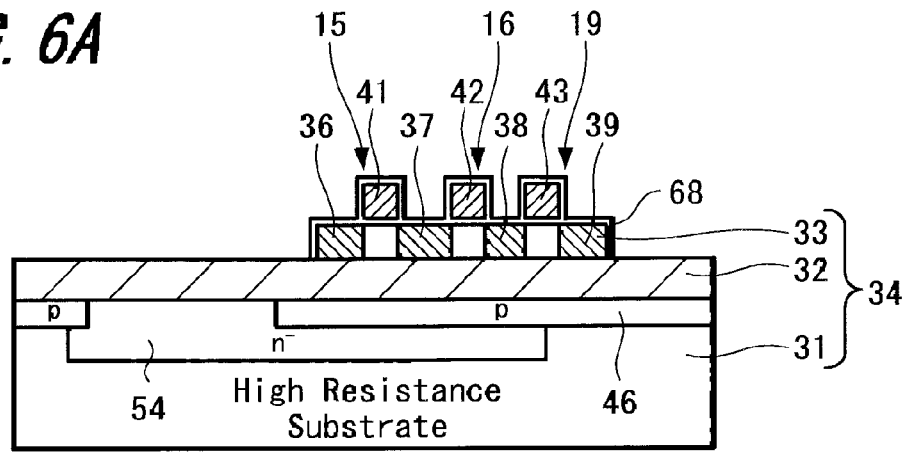
FIGS. 6A through 6C are manufacturing process diagrams (2/5) showing an embodiment of a method for manufacturing a back-illuminated type solid-state imaging device according to the present invention.

Next, as shown in FIG. 6A, a MOS transistor is formed by a typical SOI process. Specifically, after forming a gate insulation film 67 in the p-type semiconductor film 33 and forming the gate electrodes 41, 42, and 43 made of, for example, polycrystalline silicon, the n-type source-drain regions 36, 37, 38, and 39 are formed by ion implantation to form the reset transistor 15, amplifier transistor 16, and selector transistor 19. An interlayer insulation film 68 is formed on the surface of the gate electrodes 41, 42, and 43.

Figure 6B:
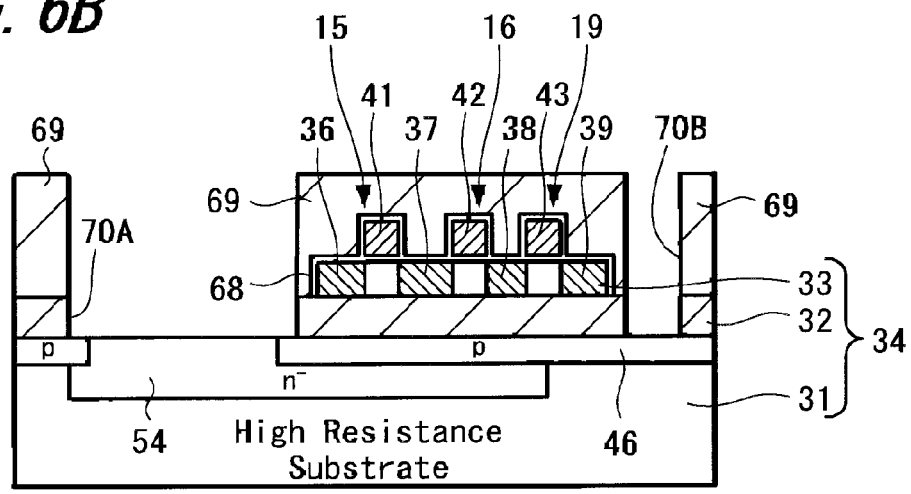

Next, as shown in FIG. 6B, a necessary region of the insulation film 32 is selectively removed by etching through a resist mask 69 to form openings 70A and 70B.

Figure 6C:
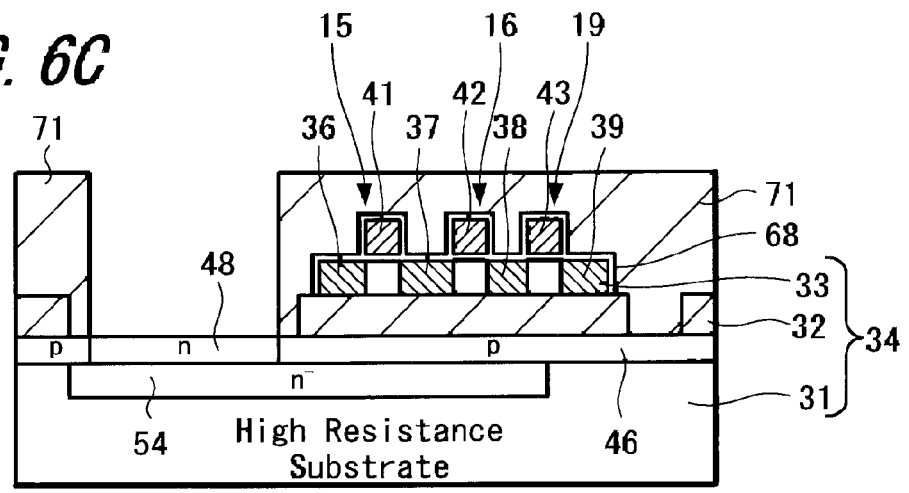

Next, as shown in FIG. 6C, the n-type semiconductor region 48 to be the charge accumulation layer of the photodiode PD is formed by ion implantation through a resist mask 71 to be adjacent to the p-type semiconductor layer 46 in the vicinity of the interface of the n− semiconductor region 54 corresponding to the opening 70A.

Figure 7A:
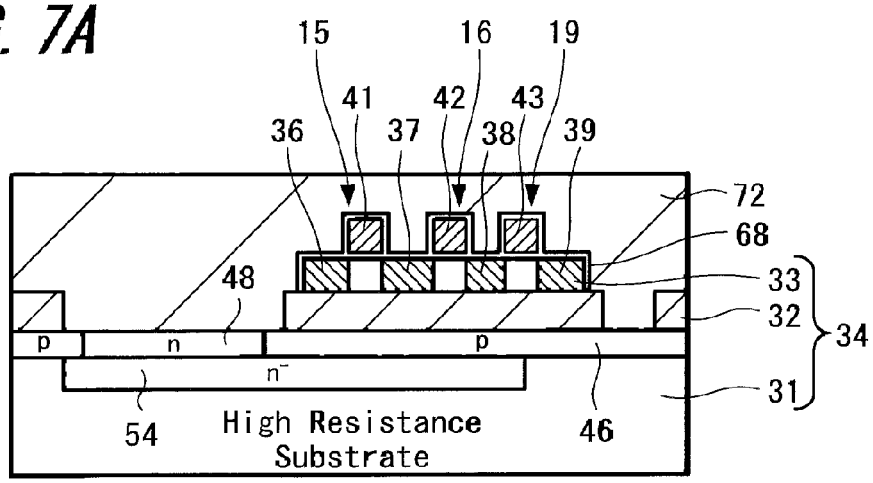
FIGS. 7A through 7C are manufacturing process diagrams (3/5) showing an embodiment of a method for manufacturing a back-illuminated type solid-state imaging device according to the present invention.

Next, as shown in FIG. 7A, an interlayer insulation film is deposited to cover all the surface including the transistors 15, 16 and 19.

Figure 7B:
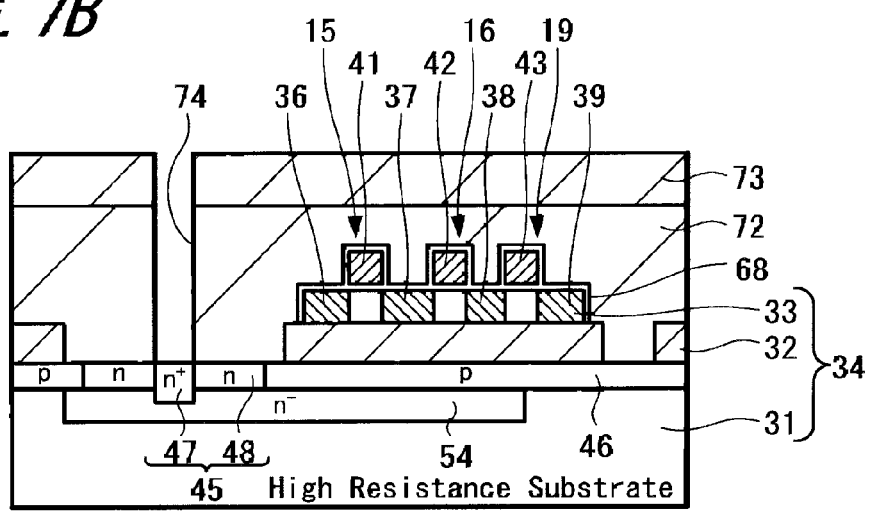

Next, as shown in FIG. 7B, a contact hole 74 to the n-type semiconductor region 48 is formed in the interlayer insulation film 72 through a resist mask 73. Further, the high concentration n-type impurity is ion-implanted to form the n-type high impurity region 47 for the ohmic contact in the n-type semiconductor region 48. The n-type semiconductor region 45 that becomes the charge accumulation layer of the photodiode PD is formed by those n-type semiconductor region 48 and n-type high impurity region 47.

Note that, contact regions to the n-type gate electrode and n-type source-drain region are also formed at the same time though not illustrated due to a limitation of a space in the drawing.

Figure 7C:
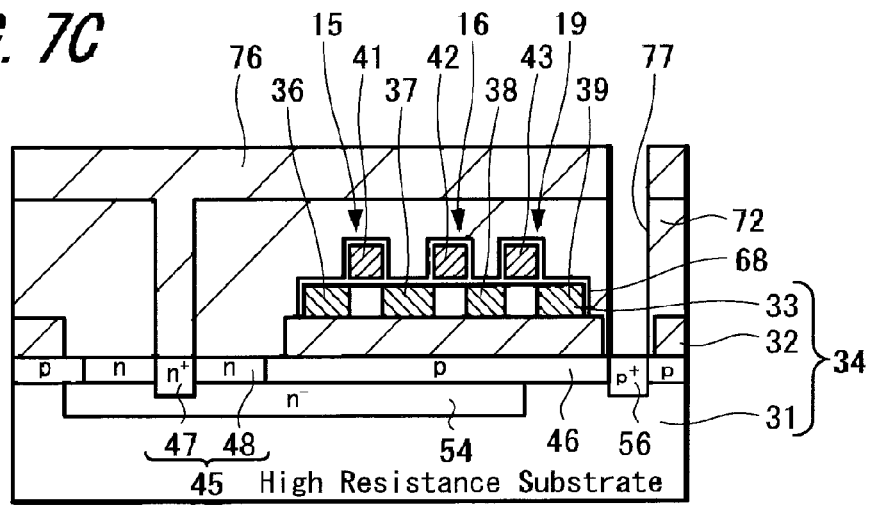

Next, as shown in FIG. 7C, a contact hole 77 to the p-type semiconductor region 46 is formed in the interlayer insulation film 72 through a resist mask 76. Further, the high concentration p-type impurity is ion-implanted to form the p-type high impurity region 56 for the ohmic contact in the p-type semiconductor region 46.

Note that, a contact regions to the p-type gate electrode and p-type source-drain region are also formed at the same time though not illustrated due to the limitation of a space in the drawing.

Figure 8A:
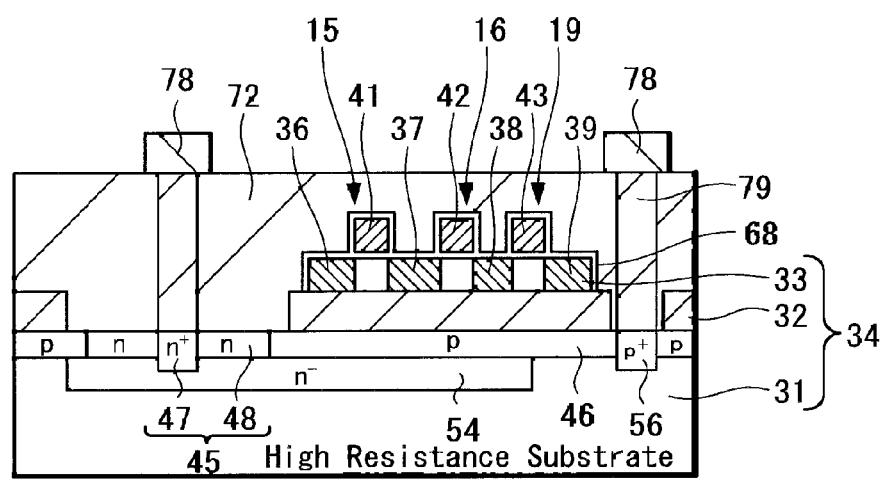
FIGS. 8A and 8B are manufacturing process diagrams (4/5) showing an embodiment of a method for manufacturing a back-illuminated type solid-state imaging device according to the present invention.

Next, as shown in FIG. 8A, a multilayer wiring 78 made of a Cu film, for example, is formed by using a typical wiring process. Although only one layer of Cu wiring to connect through a buried conduction layer 79 to each of the n-type high impurity concentration region 47 and p-type high impurity concentration region 56 is shown in the drawing in order to make the explanation simplified, a multilayer wiring is formed through the interlayer insulation film.

Figure 8B:
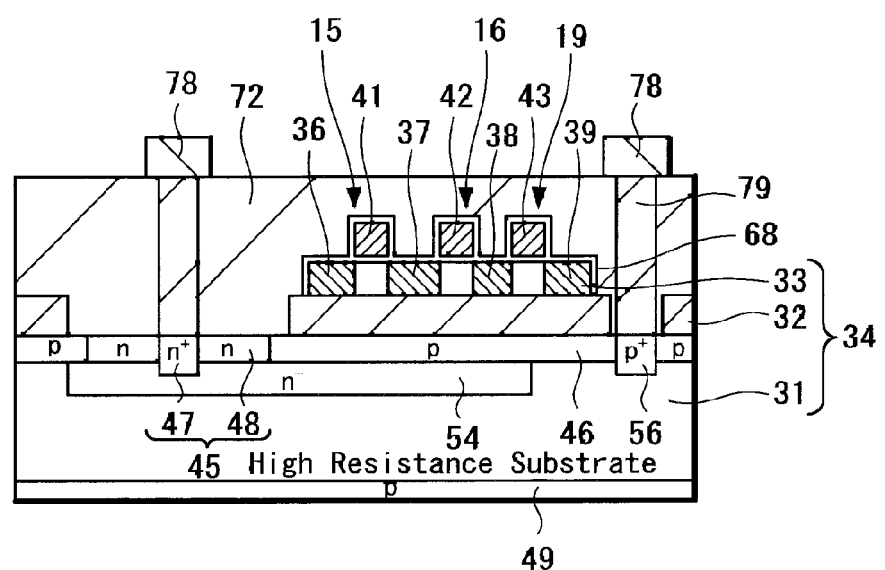

Next, as shown in FIG. 8B, after the high resistance substrate 31 is polished from the rear surface until reaching a required thickness, the p-type impurity is ion-implanted into the rear surface of the high resistance substrate 31, that is, in the vicinity of the interface to form the p-type semiconductor layer 49 of a high impurity concentration to suppress the dark current. At this time, similarly to an example in related art, the top and bottom are reversed by using a substrate support material not illustrated, when manufacturing in actuality.

Next, as shown in FIG. 9, the electron injection preventive film 50, transparent electrode 51, and rear surface electrode 55 that also serves as the light-shielding film are sequentially formed on the p-type semiconductor layer 49. After that, a color filter, an on-chip micro-lens and the like are formed to obtain an intended CMOS solid-state imaging device of the back-illuminated type.

According to the method for manufacturing the CMOS solid-state imaging device of the back-illuminated type of this embodiment, the back-illuminated type CMOS solid-state imaging device whose reliability is excellent can be manufactured in which the electric field to collect the photoelectron generated in the high resistance substrate 31 of the photodiode PD is generated reliably and the crosstalk to the adjacent pixels can be reduced.

The CMOS solid-state imaging device manufactured as described above is mounted as shown in FIG. 10. Specifically, the rear surface electrode 55 is formed on the rear surface of the semiconductor substrate 31 that includes the multilayer wiring 78 and the like, further a CMOS solid-state imaging device 82 of FIG. 9, in which the color filter, on-chip micro-lens and the like 81 are formed, is connected on the side of the multilayer wiring 78 by a bump 84 to a package bottom surface or to a circuit substrate 83, and the rear surface electrode 55 and the package bottom surface or circuit substrate 83 are connected through a bonding wire 85. The semiconductor substrate 31 is sealed with respect to the package bottom surface or the circuit substrate 83 by using a resin sealant 86. Thus, the interface between the CMOS solid-state imaging device and the outside is made by both the bump 84 and wire bonding.

Figure 10:
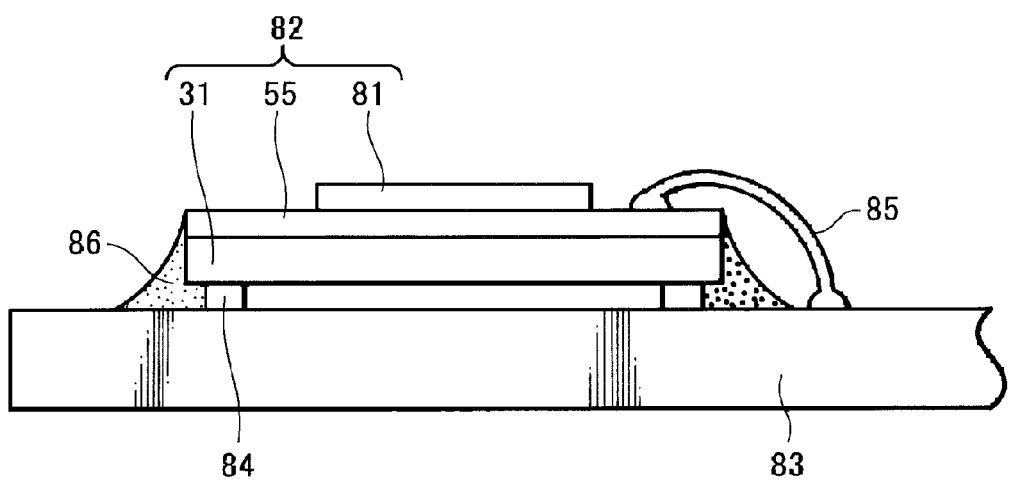
FIG. 10 is a constitutional diagram showing an example of a state when mounting a back-illuminated type solid-state imaging device according to an embodiment of the present invention.

Further, although not shown in the figure, the CMOS solid-state imaging device in FIG. 10 may be formed such that a signal processing chip replaces the package bottom surface or the circuit substrate 83 and the CMOS solid-state imaging device 82 is in a state of a CMOS image sensor chip to form a micro pad corresponding to the pixel on the front surface side of the multilayer wiring thereof, and the micro pad is overlapped and joined to the signal processing chip through a micro bump.

For those skilled in the relevant field, it should be clear that the above-described CMOS solid-state imaging device shown in FIG. 3 can be manufactured by eliminating unnecessary processes from the manufacturing method of FIGS. 5 through 9 and that various modifications thereof are possible. For example, it is also possible to reverse the order with respect to forming the transistor and forming the photodiode in the typical SOI process of FIG. 6C. Further, part of the ion implantation process of the transistor and photodiode can be shared depending on a manufacturing method.

Figure 11:
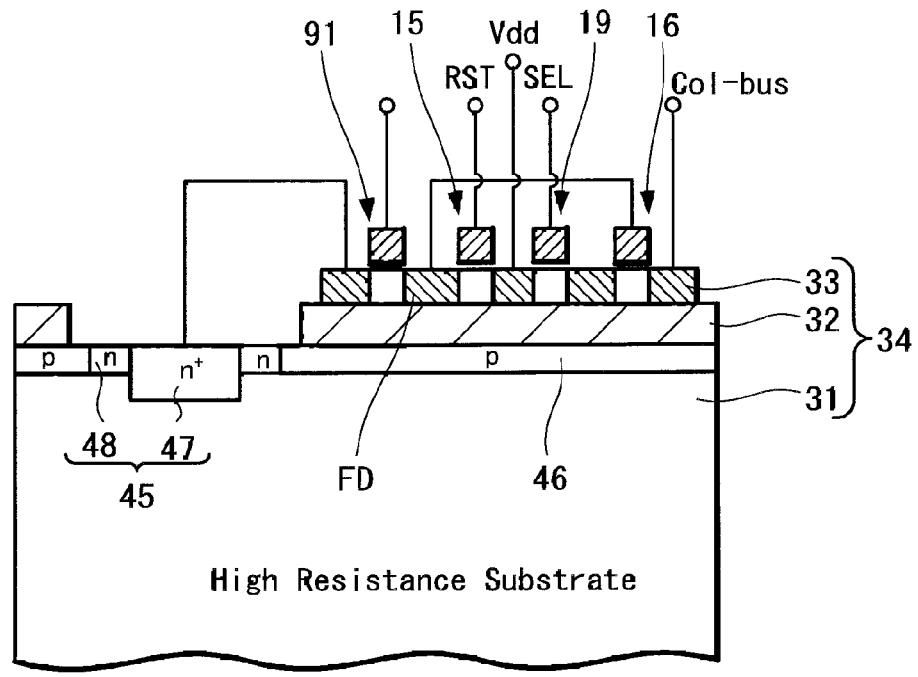
FIG. 11 is a cross-sectional diagram showing a relevant portion of a pixel according to a third embodiment of a back-illuminated type solid-state imaging device of the present invention.
Figure 12:
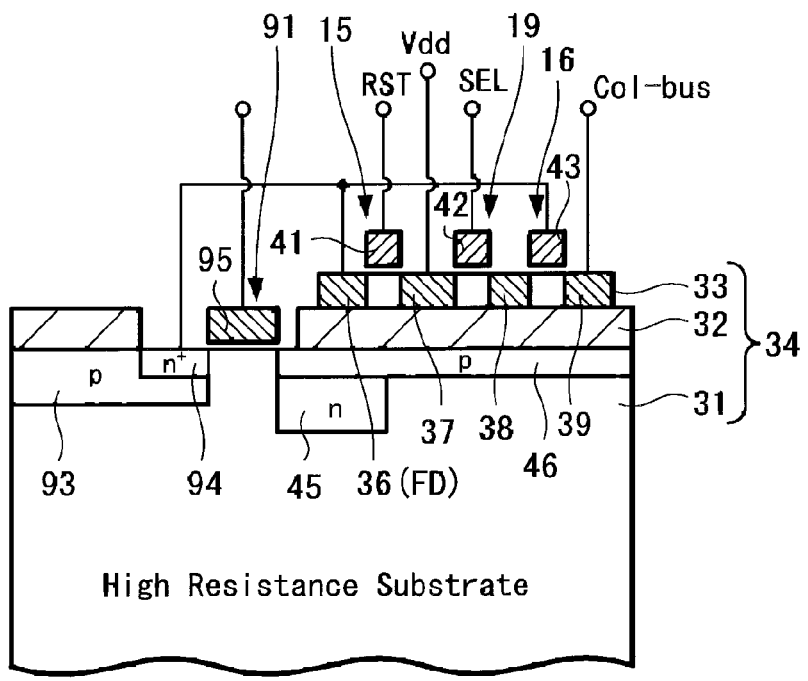
FIG. 12 is a cross-sectional diagram showing a relevant portion of a pixel according to a fourth embodiment of a back-illuminated type solid-state imaging device of the present invention.

In the CMOS solid-state imaging device of the above-described embodiments, one pixel is formed with one photodiode and three transistors; further, it is also possible to form one pixel with one photodiode and four transistors to which a transfer transistor is added. FIGS. 11 and 12 show embodiments thereof.

FIG. 11 is a cross section showing a relevant portion of a pixel according to a third embodiment of a CMOS solid-state imaging device of a back-illuminated type of the present invention. In this embodiment, a transfer transistor 91 is added to the side of the semiconductor film 33 of the SOI substrate 34. Specifically, the transfer transistor 91, reset transistor 15, selector transistor 19, and amplifier transistor 16 are formed in the semiconductor film 33. In this pixel, the high impurity concentration region 47 of the n-type semiconductor region 45 of the photodiode PD is connected to a source of the transfer transistor 91, and a drain of the transfer transistor 91 is connected to the source of the reset transistor 15. The floating diffusion FD that is a connection midpoint between the transfer transistor 91 and the reset transistor 15 is connected to the gate of the amplifier transistor 16. The source of the amplifier transistor 16 is connected to the vertical signal line, and the drain thereof is connected to the source of the selector transistor 19. In addition, the drain of the reset transistor 15 and the drain of the selector transistor 19 are connected to the power wiring that supplies the power Vdd.

Since the other structure than the above can be similar to the above-described various embodiments such as shown in FIGS. 3 and 4, a detailed explanation thereof is omitted.

FIG. 12 is a cross section showing a relevant portion of a pixel according to a fourth embodiment of a CMOS solid-state imaging device of a back-illuminated type of the present invention. In this embodiment, the transfer transistor 91 is added to the side of the high resistance substrate 31 of the SOI substrate 34. Specifically, the reset transistor 15, selector transistor 19, and amplifier transistor 16 are formed on the side of the semiconductor film 33 of the SOI substrate 34. On the other hand, the n-type semiconductor region 45 that becomes the charge accumulation layer of the photodiode PD is formed under the p semiconductor layer 46 on the side of the high resistance substrate 31, further an n-type source-drain region is formed on the side of an interface in a p-type semiconductor well region 93, a gate electrode 95 is formed through a gate insulation film on the high resistance substrate 31 between the n-type semiconductor region 45 of the photodiode PD and the n-type source-drain region 94, and the transfer transistor 91 is here formed. The wirings of the photodiode PD and each of the transistors 91, 15, 16, and 19 are similar to those in FIG. 11. In addition, a channel region whose p-type impurity concentration is adjusted is formed directly under the gate electrode 95.

Since the p-type semiconductor layer 46 of the high impurity concentration is formed on the side of the interface of the n-type semiconductor region 45 of the photodiode PD, a buried type photodiode PD called a HAD (Hole Accumulation Diode) is formed.

Since the other structure than the above can be similar to the above-described various embodiments such as shown in FIGS. 3 and 4, a detailed explanation thereof is omitted.

In the above-described embodiments, the negative voltage is fixedly applied to the rear surface electrode (to the transparent electrode 51 or rear surface electrode 55); in addition, an electronic shutter operation can also be performed without fixing the voltage applied. For example, by temporarily applying a positive voltage to the rear surface electrode, the charge (electron) accumulated in the photodiode PD is discharged to the rear surface electrode to simultaneously reset the photodiodes PD of all the pixels and so what is called a electronic shutter operation can be performed.

In addition, when the negative voltage applied to the rear surface electrode is further increased to, for example, approximately −40V in the above-described embodiments, the electric field of the high resistance substrate 31 is intensified, so that an electron avalanche phenomenon occurs while the electron moves to the front surface side and the number of electrons can be multiplied. Specifically, the sensitivity can be raised several tens of times, for example, by causing the electronic multiplication. Accordingly, a CMOS solid-state imaging device of a back-illuminated type with less noise and high sensitivity can be provided.

Although the electron multiplication is performed in a film (HARP film of NHK is known) laminated on the upper side of the wiring, a similar phenomenon can be caused on the rear surface with the structure of the above-described embodiments. Since the laminated film uses an amorphous film, there are many defects, large dark current and large lag; however, in the back-illuminated type, with a monocrystal silicon, for example, being used, such effectiveness of less defects, less dark current, and small lag can be obtained.

Although in the above-described embodiments the electron is used as the signal charge, the hole can be used as the signal charge. When the hole is used as the signal charge, the conduction type of the semiconductor substrate, semiconductor layer, photodiode and the like in the above-described structure is reversed and in addition, the pixel transistor is also formed using a transistor of the opposite polarity.

According to the above-described embodiments of the present invention, since the SOI substrate is used and after separating the photodiode and the transistor portion the rear surface electrode is provided and the voltage is applied thereto, the electric field can be formed reliably even in a photodiode having a high aspect ratio, and the CMOS solid-state imaging device of the back-illuminated type in which the crosstalk to the adjacent pixels is reduced can be provided. Further, the CMOS solid-state imaging device of the back-illuminated type in which the electronic shutter operation is performed simultaneously with respect to all the pixels can be provided by controlling the voltage applied to the rear surface electrode. Further, the CMOS solid-state imaging device of the back-illuminated type in which electron multiplication is performed in a silicon substrate and which has less noise and an improved sensitivity can be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A back-illuminated type solid-state imaging device comprising:
    a semiconductor film on a front surface side of a semiconductor substrate with an insulation film between them;
    a photoelectric conversion element that constitutes a pixel in the semiconductor substrate, the photoelectric conversion element having a charge accumulation portion;
    at least some transistors that constitute the pixel in the semiconductor film;
    a rear surface electrode to which a voltage is applied on the rear surface side of the semiconductor substrate; and
    a semiconductor layer with a conductivity type opposite of the charge accumulation portion at the front surface side of the semiconductor substrate under the insulation film, wherein,
        the charge accumulation portion is adjacent the front surface side of the substrate in a region not underlying the transistors, and
        the same voltage as the voltage applied to the rear surface electrode is applied to the semiconductor layer.

2. A back-illuminated type solid-state imaging device comprising:
    a semiconductor film on a front surface side of a semiconductor substrate with an insulation film between them;
    a photoelectric conversion element that constitutes a pixel in the semiconductor substrate, the photoelectric conversion element having a charge accumulation portion;
    at least some transistors that constitute the pixel in the semiconductor film, the transistors including a transfer transistor;
    a semiconductor layer with a conductivity type opposite that of the charge accumulation portion at the front surface side of the semiconductor substrate under the insulation film;
    a rear surface electrode to which a voltage is applied on the rear surface side of the semiconductor substrate, wherein,
        the same voltage as the voltage applied to the rear surface electrode is applied to the semiconductor layer,
        the charge accumulation portion is adjacent the front surface side of the substrate in a region not underlying the transistors, and
        a source of the transfer transistor is electrically coupled to the charge accumulation portion.

3. A back-illuminated type solid-state imaging device comprising:
    a semiconductor film on a front surface side of a semiconductor substrate with an insulation film between them,
    a photoelectric conversion element that constitutes a pixel in the semiconductor substrate, the photoelectric conversion element having a charge accumulation portion;
    at least some transistors that constitute the pixel in the semiconductor film, the transistors including a transfer transistor; and
    a rear surface electrode to which a voltage is applied on the rear surface side of the semiconductor substrate, wherein,
        the charge accumulation portion is adjacent the front surface side of the substrate in a region not underlying the transistors.

4. A back-illuminated type solid-state imaging device comprising:
    a semiconductor film on a front surface side of a semiconductor substrate with an insulation film between them;
    a photoelectric conversion element that constitutes a pixel in the semiconductor substrate, the photoelectric charge conversion element having a charge accumulation portion;
    at least some transistors that constitute the pixel in the semiconductor film, the transistors including a transfer transistor; and
    a rear surface electrode to which a voltage is applied on the rear surface side of the semiconductor substrate, wherein,
        the photoelectric conversion element is a buried type.

5. A back-illuminated type solid-state imaging device comprising:
    a semiconductor film on a front surface side of a semiconductor substrate with an insulation film between them;
    a photoelectric conversion element that constitutes a pixel in the semiconductor substrate, the photoelectric conversion element having a charge accumulation portion;
    at least some transistors that constitute the pixel in the semiconductor film;
    a semiconductor layer with a conductivity type opposite of the charge accumulation portion at the front surface side of the semiconductor substrate under the insulation film; and
    a rear surface electrode to which a voltage is applied on the rear surface side of the semiconductor substrate, wherein,
        the charge accumulation portion is adjacent the front surface side of the substrate in a region not underlying the transistors.

* * * * *